United States Patent
Yoo

[19]

[11] Patent Number: 6,159,846
[45] Date of Patent: Dec. 12, 2000

[54] METHOD OF METALLIZATION IN SEMICONDUCTOR DEVICES

[75] Inventor: Seong-Wook Yoo, Taegu, Rep. of Korea

[73] Assignee: Hyundai Electronics Industries Co., Ltd., Kyoungki-Do, Rep. of Korea

[21] Appl. No.: 08/936,398

[22] Filed: Sep. 29, 1997

[30] Foreign Application Priority Data

Apr. 2, 1997 [KR] Rep. of Korea ..................... 97-12194

[51] Int. Cl.$^7$ ................................... H01L 21/44
[52] U.S. Cl. ................ 438/652; 438/660; 438/669; 438/686; 438/687; 438/688
[58] Field of Search ..................... 438/660, 664, 438/652, 655, 656, 657, 669, 682, 683, 686, 687, 688

[56] References Cited

U.S. PATENT DOCUMENTS

| 4,520,554 | 6/1985 | Fisher . | |
| 5,869,902 | 2/1999 | Lee et al. | 257/773 |
| 5,885,898 | 3/1999 | Kim et al. | 438/663 |

Primary Examiner—John F. Niebling
Assistant Examiner—Lynne Gurley

[57] ABSTRACT

The method of metallization in semiconductor devices provides a substrate having a conducting region and having an insulating layer formed on the substrate. The insulating layer has a contact hole which exposes the conducting region. Next, a silicon-containing metallization layer and a silicon-free metallization layer are sequentially formed on the insulating layer such that the silicon-containing metallization layer contacts the conducting region through the contact hole. After heat-treating the substrate, the two metallization layers are patterned.

25 Claims, 2 Drawing Sheets

METHOD OF METALLIZATION IN SEMICONDUCTOR DEVICES

BACKGROUND OF THE INVENTION

1. Field of the Invention

The present invention relates to a method of forming a metallization layer in semiconductor devices.

2. Discussion of Related Art

Generally, as for metallization materials in semiconductor devices, aluminum or aluminum alloy is widely used because aluminum has good conductivity and adheres well to silicon oxide. Aluminum is also easy to pattern by dry-etching, and is relatively cheap. This kind of metallization layer may make contact with a diffusion area, formed by doping impurity ions in a semiconductor substrate through a contact hole, or may make contact with a gate formed of polycrystal silicon, in which impurity ions are doped.

When the metallization layer made of aluminum or aluminum alloy makes contact with silicon, a silicon spike occurs at the junction between the metallization layer and the impurity region or gate during the heat-treatment process conducted after metallization. The spike decreases a breakdown voltage of the device including the impurity region or gate due to the centering of an electrical field, or the spike causes a leakage current flow at the junction.

To prevent the generation of the spike, a barrier metal layer is formed between the metallization layer and the impurity region or gate. The barrier metal layer prevents silicon of the semiconductor substrate or the gate from diffusing into the metallization layer during the heat-treatment process. Generally, when the metallization layer is formed of silicon-free pure aluminum or aluminum alloy, silicon of 0.4 to 0.7 wt % in the semiconductor substrate or the gate diffuses into the metallization layer during the heat-treatment process.

Another method for preventing the generation of the spike forms the metallization layer of aluminum or aluminum alloy containing silicon of 1 wt %. Here, the silicon in the metallization layer prevents the silicon of the substrate or the gate from diffusing into the metallization layer; thereby preventing the generation of the spike.

FIGS. 1A–1C illustrate this method for preventing the generation of a silicon spike. As illustrated in FIG. 1A, an insulating layer 13 is formed on a substrate 11 containing silicon. The insulating layer 13 is patterned by a typical photolithography process to form a contact hole 15 exposing the substrate 11. Alternately, the substrate 11 could represent a polycrystal silicon gate of a semiconductor device.

As illustrated in FIG. 1B, impurity ions of a conductivity type opposite to that of the substrate 11 are heavily doped on the portion of the substrate 11 exposed by the contact hole 15 to form a diffused region 17. However, if the substrate 11 is a conducting line made of polycrystal silicon, such as the gate of a semiconductor device, opposite conductivity type impurity ions are not doped therein.

As illustrated in FIG. 1C, aluminum or aluminum alloy containing silicon of 1 wt % is doped to make contact with the diffusion region 17 through the contact hole 15 by CVD or sputtering. The doped aluminum or aluminum alloy is patterned by photolithography to form the metallization layer 19. Here, after the aluminum or aluminum alloy is doped, it is heat treated at a temperature of 450 to 500° C., so that the aluminum or aluminum alloy making contact with the substrate 11 realizes good ohmic contact. The silicon in the substrate 11 does not diffuse into the metallization layer 19 because of the silicon originally contained in the aluminum or aluminum alloy forming the metallization layer 19, and the spike is not generated.

In the above-mentioned conventional metallization layer forming method, aluminum or aluminum alloy containing silicon of 1 wt % is formed in contact with the diffusion region through the contact hole, and the substrate and the doped aluminum or aluminum alloy are heat-treated to realize an ohmic contact.

But, in the conventional method, silicon originally contained in the aluminum or aluminum alloy precipitates during cooling after the heat-treatment, and the precipitated silicon grows by using the substrate as a seed. As a result, the precipitated silicon reduces the junction area between the substrate and the metallization layer; thereby increasing the junction resistance.

SUMMARY OF THE INVENTION

Accordingly, the present invention is directed to a method of forming a metallization layer in semiconductor devices that substantially obviates one or more of the problems due to limitations and disadvantages of the related art.

An object of the present invention is to provide a method of forming a metallization layer of semiconductor devices which prevents the decrease of the junction area between a substrate and the metallization layer due to the precipitation of the silicon contained in aluminum or aluminum alloy, and thus prevents the increase of the junction resistance.

These and other objects are achieved by providing a method of metallization in semiconductor devices, comprising the steps of: providing a substrate having a conducting region and having an insulating layer formed on the substrate, the insulating layer having a contact hole which exposes the conducting region; sequentially forming a first metallization layer, which includes silicon, and a second metallization layer, which does not include silicon, on the insulating layer such that the first metallization layer contacts the conducting region through the contact hole; heat-treating the substrate; and patterning the first and second metallization layers.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Figure 1A:
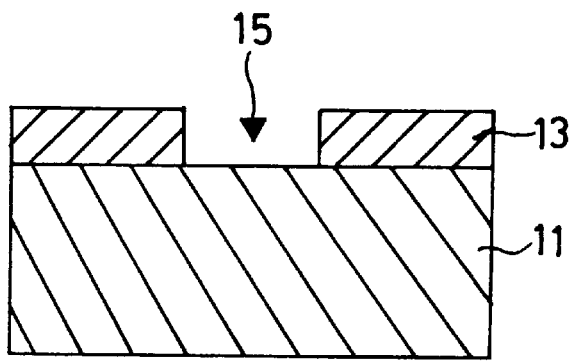
FIGS. 1A to 1C illustrate the conventional fabricating procedures of a conventional metallization layer of semiconductor devices.
Figure 1B:
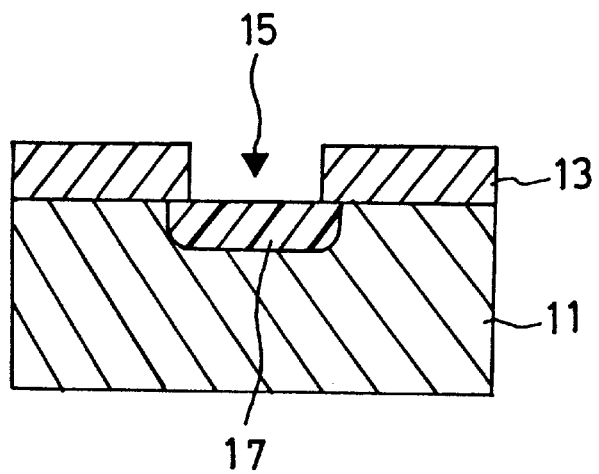
Figure 1C:
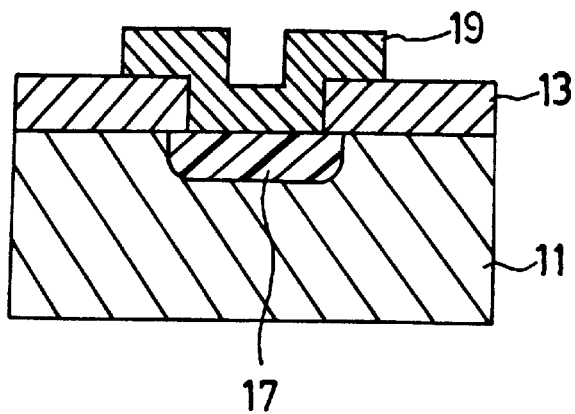
Figure 2A:
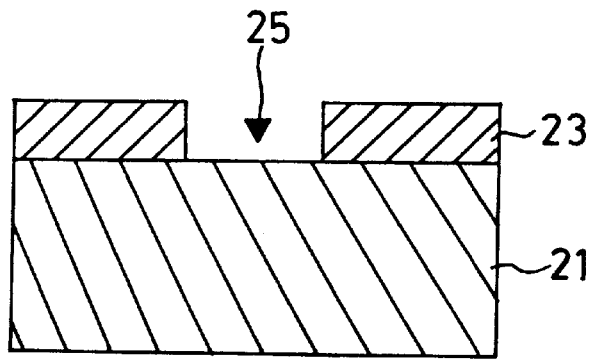
FIGS. 2A to 2C illustrate the fabrication procedures of a metallization layer of semiconductor devices according to the present invention.
Figure 2B:
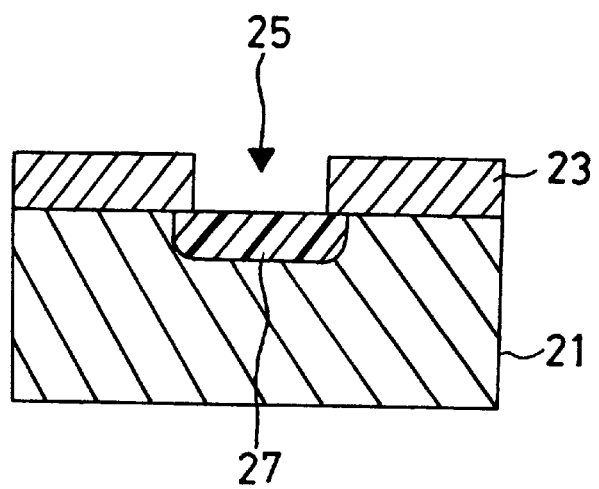
Figure 2C:
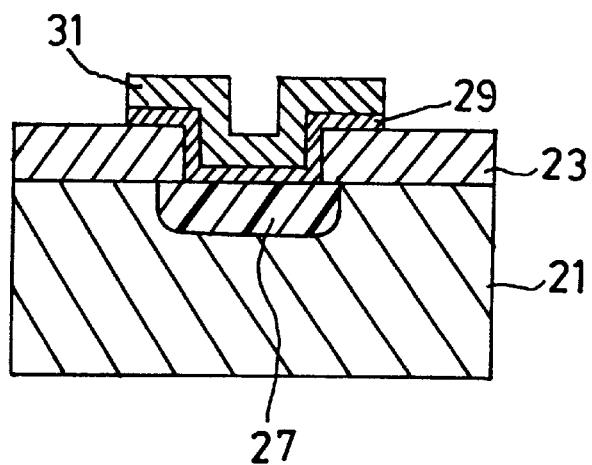

FIGS. 2A–2C illustrate the method according to the present invention for forming a metallization layer. As illustrated in FIG. 2A, an insulating layer 23 is formed on a substrate 21 containing silicon. The insulating layer 23 is patterned by a typical photolithography process to form a contact hole 25 exposing the substrate 21. Alternatively, the substrate 21 could represent a polycrystal silicon gate of a semiconductor device.

As illustrated in FIG. 2B, impurity ions of a conductivity type opposite to that of the substrate 21 are heavily doped on the portion of the substrate 21 exposed by the contact hole 25 to form a diffused region 27. However, if the substrate 21 is a conducting line made of the polycrystal silicon, such as the gate of a semiconductor device, the opposite conductivity type impurity ions are not doped therein.

As illustrated in FIG. 2C, first and second metallization layers 29 and 31 are sequentially formed on the insulating layer 23 by CVD or sputtering. The first metallization layer 29 is formed using a conducting metal such as Al, Au, Ag, Cu or Sn or their alloy, and is formed to a thickness of 500 to 4,000 Å. Also, the first metallization layer 29 is formed to contain silicon of 0.5 to 3 wt %.

The second metallization layer 31 is formed by depositing the same conducting metals, but without the silicon, used to form the first metallization layer 29, and is formed to a thickness of 500 to 20,000 Å. The first and second metallization layers 29 and 31 are then heat-treated at a temperature of 450 to 500° C. so that they make good ohmic contact with the substrate 21.

The silicon in the substrate 21 cannot diffuse into the first and second metallization layers 29 and 31 due to the silicon originally contained in the first metallization layer 29, and thereby the generation of a silicon spike is prevented.

Furthermore, the silicon originally contained in the first metallization layer 29 diffuses across the second silicon-free metallization layer 31. Because the first metallization layer 29 is thinner than the second metallization layer 31, the silicon content of each of the first and second metallization layers 29 and 31 is relatively smaller than the original silicon content of the first initial metallization layer 29 with respect to the conducting metal, such as Au, Ag, Cu or Sn. For example, when the first and second metallization layers 29 and 31 are formed of aluminum, the silicon originally contained in the first metallization layer 29 is 1 wt %. Therefore, the silicon contained in each of the first and second metallization layers 29 and 31 is smaller than 1 wt % after the heat-treatment process. Because of this low silicon content, the amount of silicon which precipitates at the surface of the substrate 21 during the cooling following the heat-treatment process is significantly reduced, and the junction area between the substrate 21 and the first metallization layer 29 increases.

The first and second metallization layers 29 and 31 are then patterned by photolithography.

The method of forming the metallization layer in semiconductor devices according to the present invention, forms the first metallization layer of conducting metals containing silicon of 0.5 to 3 wt %, and forms the second metallization layer of the same conducting metals, but without the silicon, which form the first metallization layer. The first and second metallization layers are sequentially formed on an insulating layer having a contact hole exposing the substrate, and those layers are heat-treated, with the silicon contained in the first metallization layer preventing the silicon in the substrate from diffusing into the first and second metallization layers during the heat-treatment. Because the silicon content in each of the first and second metallization layers is relatively smaller than that originally in the first metallization layer, the silicon precipitation material at the junction of the substrate and the first metallization layer is reduced.

Therefore, the invention reduces the silicon precipitation at the junction of the substrate and the first metallization layer, and thus increases the junction area. This results in a decrease of the junction resistance.

It will be apparent to those skilled in the art that various modifications and variations can be made in the method of forming a metallization layer of semiconductor devices of the present invention without departing from the spirit or scope of the invention. Thus, it is intended that the present invention cover the modifications and variations of this invention provided they come within the scope of the appended claims and their equivalents.

What is claimed is:

1. A method of metallization in semiconductor devices, comprising the steps of:
providing a substrate having a conducting region and having an insulating layer formed on the substrate, the insulating layer having a contact hole which exposes the conducting region;
sequentially forming a first metallization layer, which includes silicon, and a second metallization layer being in direct contact with the first metallization layer, which does not include silicon, on the insulating layer such that the first metallization layer directly contacts the conducting region through the contact hole;
heat-treating the substrate after sequentially forming the first and second metallization layers; and
patterning the first and second metallization layers.

2. The method as claimed in claim 1, wherein the conducting region is a diffusion region in the silicon substrate.

3. The method as claimed in claim 1, wherein the conducting region is a conducting line made of polycrystal silicon.

4. The method as claimed in claim 1, wherein the first and second metallization layers are formed of the same conducting metals.

5. The method as claimed in claim 4, wherein the first and second metallization layers are formed of Al, Au, Ag, Cu or Sn.

6. The method as claimed in claim 5, wherein the first metallization layer is formed to a thickness of 500 to 4000 Å.

7. The method as claimed in claim 6, wherein the first metallization layer includes silicon of 0.5 to 3 wt %.

8. The method as claimed in claim 5, wherein the second metallization layer is formed to a thickness of 500 to 20000 Å.

9. The method as claimed in claim 6, wherein the first and second metallization layers are formed by CVD or sputtering.

10. The method as claimed in claim 8, wherein the first and second metallization layers are formed by CVD or sputtering.

11. The method as claimed in claim 1, wherein the first metallization layer is formed to a thickness of 500 to 4000 Å.

12. The method as claimed in claim 1, wherein the first metallization layer includes silicon of 0.5 to 3 wt %.

13. The method as claimed in claim 1, wherein the second metallization layer is formed to a thickness of 500 to 20000 Å.

14. A method of metallization in semiconductor devices, comprising the steps of:

forming an insulating layer on a first conductivity type silicon substrate;

patterning the insulating layer to form a contact hole exposing a portion of the silicon substrate;

doping second conductivity type impurity ions in the exposed portion of the silicon substrate to form a diffusion region;

sequentially forming a first metallization layer, which includes silicon, and a second metallization layer being in direct contact with the first metallization layer, which does not include silicon, on the insulating layer such that the first metallization layer directly contacts the conducting region through the contact hole;

heat-treating the substrate after sequentially forming the first and second metallization layers; and patterning the first and second metallization layers.

15. The method as claimed in claim 14, wherein the first and second metallization layers are formed of Al, Au, Ag, Cu or Sn.

16. The method as claimed in claim 15, wherein the first metallization layer includes silicon of 0.5 to 3 wt %.

17. The method as claimed in claim 14, wherein the first metallization layer includes silicon of 0.5 to 3 wt %.

18. The method as claimed in claim 14, wherein the first metallization layer is formed to a thickness of 500 to 4000 Å.

19. The method as claimed in claim 14, wherein the second metallization layer is formed to a thickness of 500 to 20000 Å.

20. A method of metallization in semiconductor devices, comprising the steps of:

forming an insulating layer on a substrate having a conducting line made of polycrystal silicon;

patterning the insulating layer to form a contact hole exposing at least a portion of the conducting line;

sequentially forming a first metallization layer, which includes silicon, and a second metallization layer being in direct contact with the first metallization, which does not include silicon, on the insulating layer such that the first metallization layer directly contacts the conducting region through the contact hole;

heat-treating the substrate after sequentially forming the first and second metallization layers; and patterning the first and second metallization layers.

21. The method as claimed in claim 20, wherein the first and second metallization layers are formed of Al, Au, Ag, Cu or Sn.

22. The method as claimed in claim 21, wherein the first metallization layer includes silicon of 0.5 to 3 wt %.

23. The method as claimed in claim 20, wherein the first metallization layer includes silicon of 0.5 to 3 wt %.

24. The method as claimed in claim 20, wherein the first metallization layer is formed to a thickness of 500 to 4000 Å.

25. The method as claimed in claim 20, wherein the second metallization layer is formed to a thickness of 500 to 20000 Å.

* * * * *

UNITED STATES PATENT AND TRADEMARK OFFICE
CERTIFICATE OF CORRECTION

| | | |
|---|---|---|
| PATENT NO. | : 6,159,846 | Page 1 of 1 |
| APPLICATION NO. | : 08/936398 | |
| DATED | : December 12, 2000 | |
| INVENTOR(S) | : Seong-Wook Yoo | |

It is certified that error appears in the above-identified patent and that said Letters Patent is hereby corrected as shown below:

Claims

Delete the paragraph in column 5, line 9, through column 5, line 14 (claim 14, lines 13-16) and insert the following paragraph in its place:

--sequentially forming a first metallization layer, which includes silicon, and a second metallization layer being in direct contact with the first metallization layer, which does not include silicon, on the insulating layer such that the first metallization layer directly contacts the diffusion region through the contact hole;--

Delete the paragraph in column 6, lines 7-12 (claim 20, lines 7-12) and insert the following paragraph in its place:

--sequentially forming a first metallization layer, which includes silicon, and a second metallization layer being in direct contact with the first metallization layer, which does not include silicon, on the insulating layer such that the first metallization layer directly contacts the conducting line through the contact hole;--

Signed and Sealed this
Tenth Day of May, 2016

Michelle K. Lee
*Director of the United States Patent and Trademark Office*